(12) United States Patent
Hiner et al.

(10) Patent No.: US 6,930,257 B1
(45) Date of Patent: Aug. 16, 2005

(54) INTEGRATED CIRCUIT SUBSTRATE HAVING LAMINATED LASER-EMBEDDED CIRCUIT LAYERS

(75) Inventors: David Jon Hiner, Chandler, AZ (US); Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/392,738

(22) Filed: Mar. 19, 2003

Related U.S. Application Data

(63) Continuation-in-part of application No. 10/138,225, filed on May 1, 2002, and a continuation-in-part of application No. 10/261,868, filed on Oct. 1, 2002.

(51) Int. Cl.[7] .......................... H01R 12/04; H05K 1/11
(52) U.S. Cl. ...................... 174/262; 174/256; 174/257; 174/264; 174/261
(58) Field of Search .............................. 174/262, 260, 174/255, 256, 257, 261, 264; 361/760, 795

(56) References Cited

U.S. PATENT DOCUMENTS

| | | | |
|---|---|---|---|
| 4,322,778 A | | 3/1982 | Barbour et al. |
| 4,685,033 A | | 8/1987 | Inoue |
| 4,706,167 A | * | 11/1987 | Sullivan ..................... 361/774 |
| 4,811,082 A | | 3/1989 | Jacobs et al. |
| 5,021,047 A | | 6/1991 | Movern |
| 5,072,075 A | | 12/1991 | Lee et al. |
| 5,110,664 A | * | 5/1992 | Nakanishi et al. ....... 428/195.1 |
| 5,191,174 A | | 3/1993 | Chang et al. |
| 5,229,550 A | | 7/1993 | Bindra et al. |
| 5,239,448 A | | 8/1993 | Perkins et al. |
| 5,371,654 A | * | 12/1994 | Beaman et al. ............. 361/744 |
| 5,404,044 A | | 4/1995 | Booth et al. |
| 5,508,938 A | | 4/1996 | Wheeler |
| 5,582,858 A | * | 12/1996 | Adamopoulos et al. ..... 156/281 |
| 5,774,340 A | | 6/1998 | Chang et al. |
| 5,847,453 A | | 12/1998 | Uematsu et al. |
| 5,936,843 A | * | 8/1999 | Ohshima et al. ............ 361/760 |
| 6,081,036 A | | 6/2000 | Hirano et al. |

(Continued)

OTHER PUBLICATIONS

NN 9311589 IBM Nov. 1, 1993.

*Primary Examiner*—Kamand Cuneo
*Assistant Examiner*—Ishwar (I. B.) Patel
(74) *Attorney, Agent, or Firm*—Weiss, Moy & Harris, P.C.

(57) ABSTRACT

An integrated circuit substrate having laminated laser-embedded circuit layers provides a multi-layer high-density mounting and interconnect structure for integrated circuits. A prepared substrate, which may be a rigid double-sided dielectric or film dielectric with conductive patterns plated, etched or printed on one or both sides is laminated with a thin-film dielectric on one or both sides. The thin-film is laser-ablated to form channels and via apertures and conductive material is plated or paste screened into the channels and apertures, forming a conductive interconnect pattern that is isolated by the channel sides and vias through to the conductive patterns on the prepared substrate. An integrated circuit die and external terminals can then be attached to the substrate, providing an integrated circuit having a high-density interconnect.

18 Claims, 3 Drawing Sheets

U.S. PATENT DOCUMENTS

| | | | |
|---|---|---|---|
| 6,175,087 B1 | 1/2001 | Keesler et al. | |
| 6,204,453 B1 | 3/2001 | Fallon et al. | |
| 6,239,485 B1 | 5/2001 | Peters et al. | |
| 6,274,821 B1 * | 8/2001 | Echigo et al. | 174/255 |
| 6,351,031 B1 | 2/2002 | Iijima et al. | |
| 6,365,975 B1 | 4/2002 | DiStefano et al. | |
| 6,376,906 B1 | 4/2002 | Asai et al. | |
| 6,479,762 B2 * | 11/2002 | Kusaka | 174/261 |
| 6,586,682 B2 * | 7/2003 | Strandberg | 174/255 |
| 6,608,757 B1 | 8/2003 | Bhatt et al. | |

* cited by examiner

INTEGRATED CIRCUIT SUBSTRATE HAVING LAMINATED LASER-EMBEDDED CIRCUIT LAYERS

CROSS-REFERENCE TO RELATED APPLICATIONS

The present application is a Continuation-in-Part of U.S. patent application entitled "INTEGRATED CIRCUIT SUBSTRATE HAVING LASER-EMBEDDED CONDUCTIVE PATTERNS AND METHOD THEREFOR", Ser. No. 10/138,225 filed May 1, 2002, by the same inventors and assigned to the same assignee and is also a Continuation-in-Part of U.S. patent application entitled "INTEGRATED CIRCUIT FILM SUBSTRATE HAVING EMBEDDED CONDUCTIVE PATTERNS AND VIAS", Ser. No. 10/261,868 filed Oct. 1, 2002 having at least one common inventor and assigned to the same assignee. The specifications of the above-referenced patent applications are herein incorporated by reference.

FIELD OF THE INVENTION

The present invention relates generally to semiconductor packaging, and more specifically, to a substrate having laminated circuit layers added to a prepared substrate for providing electrical inter-connection within an integrated circuit package.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

Multi-layer substrates have been used to increase interconnect density, as a high interconnect density is required in present-day integrated circuits such as very-large-scale-integrated (VLSI) circuits. However, the cost of a typical multi-layer substrate is substantially higher than a single or double-sided circuit substrate. The thickness of a typical multi-layer substrate is generally a sum of equal dielectric layers along with the metal conductor layers.

Multi-layer substrate also typically have the same layer thickness and are limited to line pitch and conductor spacing without incorporating the advantages disclosed in the above-referenced patent applications.

Therefore, it would be desirable to provide a method and substrate having multiple conductive layers without the associated cost and thickness of a typical multi-layer substrate. It would further be desirable to provide increased conductor density and reduced inter-conductor spacing within an integrated substrate having multiple layers.

SUMMARY OF THE INVENTION

The above objectives of providing a thin, low-cost multi-layer substrate having increased interconnect density is provided in a substrate having laminated layers including laser-embedded conductive patterns and a method for manufacturing.

The substrate comprises a prepared substrate layer that may be a rigid dielectric layer or a film having conductive patterns disposed on one or more surfaces. One or more thin-film dielectric sheets are laminated on one or more sides of the prepared substrate and laser-embedding is used generate to a circuit pattern within the one or more thin-film dielectric sheets in order to embed conductors in channels beneath the surface of the thin-film dielectric sheets. Conductive material is then plated or paste screened into the channels. The process can be extended to multiple layers to create a sandwich structure for very high conductor density applications.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The above-incorporated patent applications disclose various processes and structures for manufacturing low-cost substrates having high conductor density and electrical integrity by laser-embedding conductive patterns below the surface of a substrate. The present invention transforms a prepared substrate having conductors etched, printed or plated on surfaces thereof into a laminated multi-layer substrate having laser-embedded conductors in the laminated layers. The addition of laser-embedded laminated layers provides a very high conductor density, while adding a low incremental cost to a low-cost substrate.

Figure 1A:
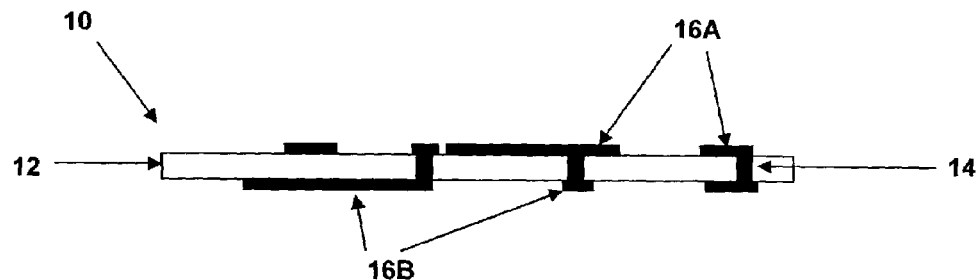
FIG. 1A is a pictorial diagram depicting a cross sectional side view of a prepared substrate for forming a laminated substrate in accordance with an embodiment of the invention.
Figure 1B:
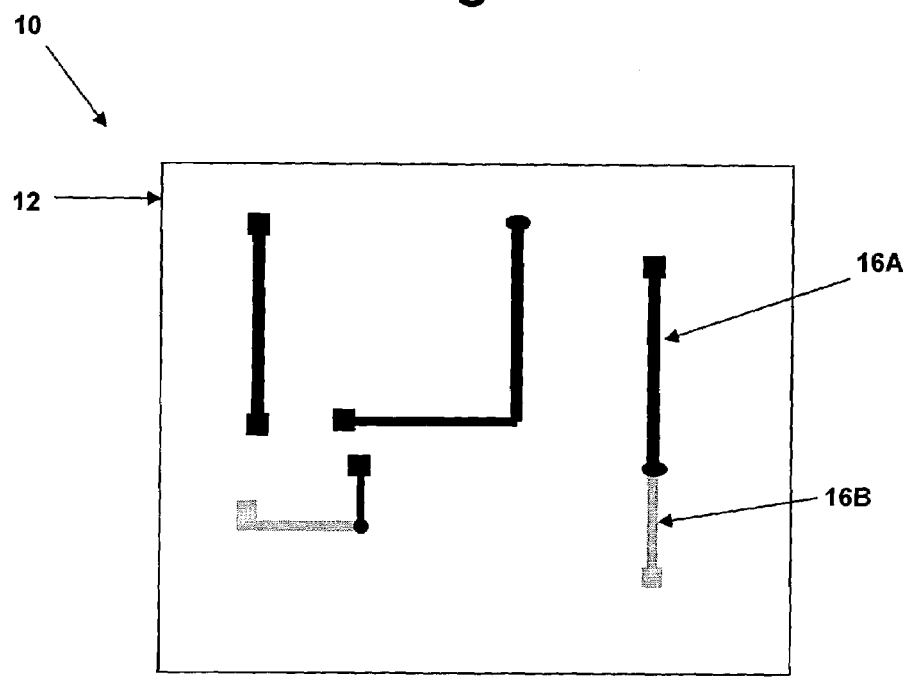
FIG. 1B is a pictorial diagram depicting a top view of a prepared substrate for forming a laminated substrate in accordance with an embodiment of the invention.

Referring now to the figures and in particular to FIG. 1A, a side view of prepared substrate 10 for use in forming a laminated substrate in accordance with an embodiment of the present invention is depicted. Circuit patterns are provided on both sides of substrate 10 by metal layers 16A and 16B with via connections 14 providing interconnectivity between metal layers 16A and 16B, but the present invention may be implemented with single-sided or multi-layer pre-pared substrates, as well. FIG. 1B shows a top view of prepared substrate 10 showing an exemplary pattern formed by metal layers 16A and 16B.

Figure 2A:
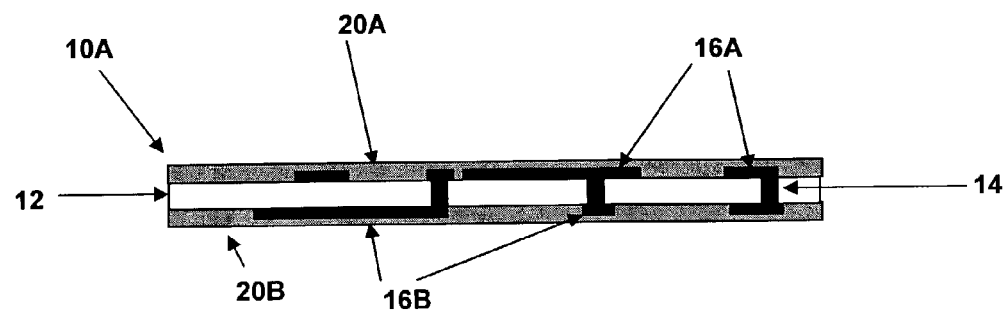
FIGS. 2A–2D are pictorial diagrams depicting cross-sectional side views of various stages of preparation of a laminated substrate in accordance with an embodiment of the invention.
Figure 2B:
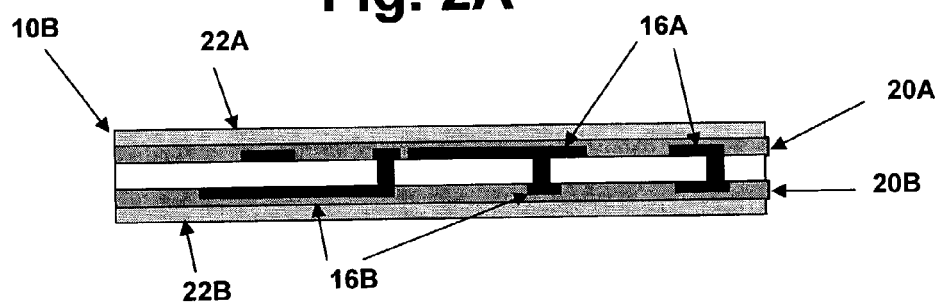

Referring now to FIG. 2A, the first stage in laminating prepared substrate to form a modified substrate 10A is shown. Adhesive layers 20A and 20B are applied to each side of substrate 10 for attachment of thin-film dielectric layers. FIG. 2B shows application of thin film dielectric layers 22A and 22B to each side of substrate 10A to form laminated substrate 10B. While the depicted embodiment of the process shows a separate application of adhesive 20A and 20B and thin-film layers 22A and 22B, a single application of a film having and adhesive backing may be applied to prepared substrate 10 in accordance with another embodiment of the process of the present invention, yielding the structure depicted in FIG. 2B (substrate 10B) in a single application step.

Figure 2C:
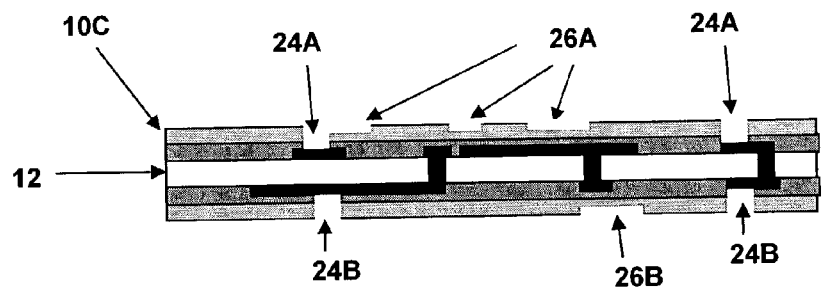
Figure 2D:
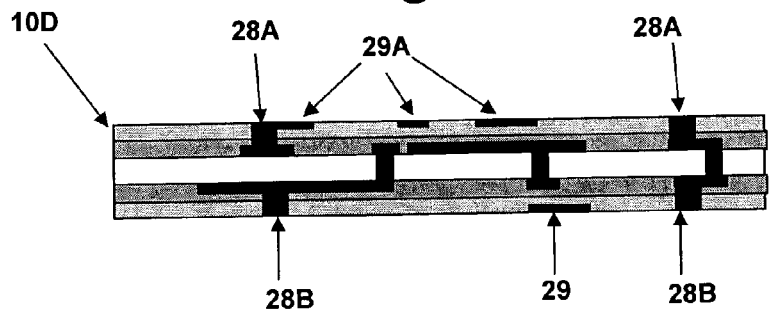

Referring now to FIG. 2C, laminated substrate 10B is laser-ablated on each side to form apertures 24A and 24B for vias, and channels 26A and 26B for circuit patterns. Channels 26A and 26B are shown as having a bottom within thin-film dielectric layers 22A and 22B, but laser-ablation may be performed to place the bottom of channels 26A and 26B at the top of or within adhesive layers 20A and 20B, providing direct contact with adhesive layers 20A and 20B and metal that will be subsequently deposited within channels 26A and 26B, improving the adhesion of the deposited metal to the substrate. In an alternative embodiment of the present invention, a thin-film dielectric layer having laser-ablated channels 26A and 26B and via apertures 24A and 24B may be aligned with and applied to substrate 10A in one step. Further, the alternative thin-film process may apply a thin-film dielectric layer having laser-ablated channels 26A and 26B and via apertures 24A and 24B along with an adhesive backing as described above may be aligned and applied to substrate 10 in a single step.

After substrate 10C is formed, metal is plated or paste-screened within channels 26A and 26B and via apertures 24A and 24B to form circuit patterns 29A, 29B and vias 28A, 28B beneath the top surface of substrate 10C forming substrate 10D. Metal may be over-plated and subsequently etched to conform with the outside surfaces of thin-film dielectric layers 22A and 22B, or may be slightly over-etched to place the outside surfaces of circuit patterns 29A, 29B and vias 28A, 28B below the outside surfaces of thin-film dielectric layers 22A and 22B. Alternatives to metal such as conductive polymers or materials having conductive fibers suspended in a mixture may also be applied within channels and 26A and 26B and via apertures 24A and 24B to form circuit patterns 29A, 29B and vias 28A in accordance with alternative embodiments of the present invention.

The above-described process may be extended to the application of multiple thin-film laminations on a prepared substrate. Additional adhesive/thin-film/conductor layers may be applied as described above to substrate 10D with connections to channel 29A, 29B and via 28A, 28B conductors provided by vias laser-ablated through the additional thin-film dielectric layers. Via apertures may be laser-ablated through multiple thin-film laminations in one step, providing a uniform aperture wall for vias extending through multiple thin-film dielectric layers.

Figure 3A:
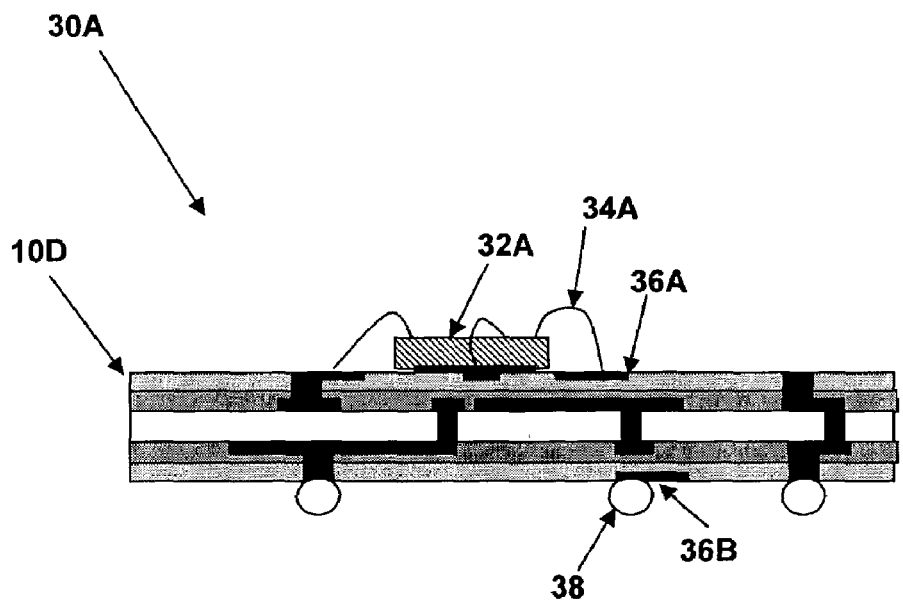
FIGS. 3A and 3B are pictorial diagrams depicting integrated circuits in accordance with embodiments of the invention.
Figure 3B:
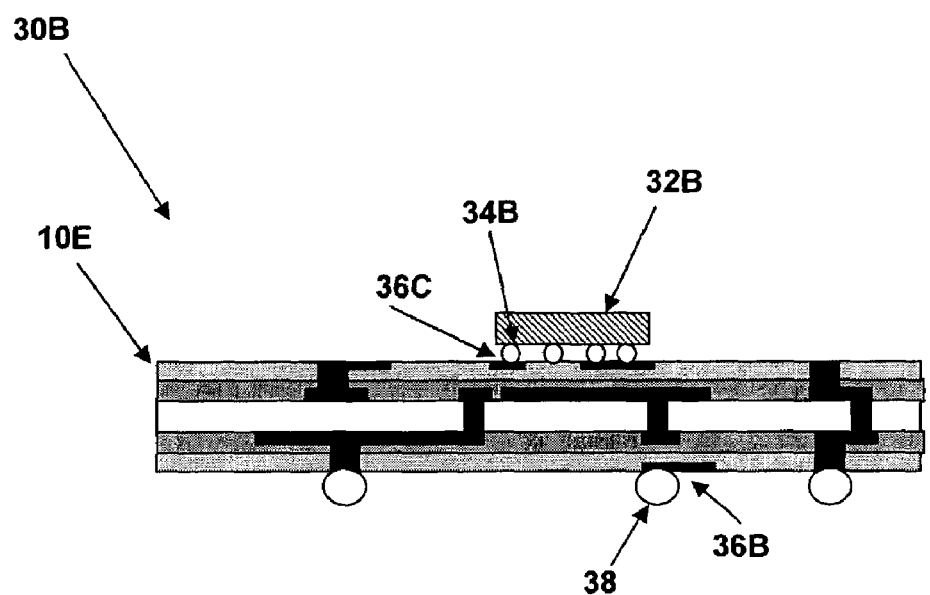

Referring now to FIG. 3A, an integrated circuit 30A in accordance with an embodiment of the present invention is depicted. An integrated circuit die 32A is attached to substrate 10D using a bonding agent such as epoxy. While die 32A is depicted as mounted above substrate 10D, a die mounting recess may also be laser-ablated or otherwise provided in substrate 10D, reducing the package height. For example, a die mounting aperture may be provided completely through thin-film dielectric layer 22A in an area free of channels and vias, to reduce the package height by the thickness of thin film-dielectric layer 22A. A cavity in prepared substrate 10 may also be provided and aligned with an aperture in thin-film dielectric layer 22A to further reduce package height.

Electrical interconnects 34A (wires) from die 32A are wire bonded to the circuit pattern on the top side of substrate 10D electrically connecting die 32A to bonding areas 36A providdded by channel circuit patterns 29A and/or vias 28A. External terminals 38, depicted as solder balls, are attached to BGA lands 36B provided by channel circuit patterns 29B and/or vias 28B, providing a complete integrated circuit that may be encapsulated.

Referring now to FIG. 4B, an integrated circuit in accordance with an alternative embodiment of the invention is depicted. Die 32B is a "flip-chip" die that is directly bonded to a substrate 10E via solder balls 36C. External solder ball terminals 38 are provided as in the embodiment of FIG. 3A. Substrate 10E is fabricated in the same manner as substrate 10D, but may have a differing configuration to support the flip-chip die 32B interconnect.

The above description of embodiments of the invention is intended to be illustrative and not limiting. Other embodiments of this invention will be obvious to those skilled in the art in view of the above disclosure and fall within the scope of the present invention.

What is claimed is:

1. A substrate for a microelectronic circuit, comprising:
a prefabricated dielectric layer having a circuit material pattern formed on at least a layer top side thereof;
a thin-film dielectric layer having a thin-film bottom side laminated to the layer top side of the prefabricated dielectric layer and having laser-ablated perforations formed on a thin-film top side; and
conductive circuit material deposited within the laser-ablated perforations for forming a conductive pattern below the thin-film top side within the thin-film dielectric layer, wherein a portion of the laser perforations are conductor channels formed in the thin-film top side of the thin-film dielectric layer but not contacting the circuit material pattern.

2. The substrate of claim 1, wherein the prefabricated dielectric layer is a dielectric film.

3. The substrate of claim 1, wherein the prefabricated dielectric layer is a rigid dielectric layer.

4. The substrate of claim 1, wherein the laser-ablated perforations include blind via holes formed through from the thin-film top side of the thin-film dielectric layer to contact the circuit material pattern.

5. The substrate of claim 1, wherein the conductive material is a plated conductor, plated within the laser-ablated perforations.

6. The substrate of claim 1, wherein the conductive material is a screened conductive paste, screened within the laser-ablated perforations.

7. The substrate of claim 1, further comprising an adhesive layer interposed between a thin-film bottom side of the thin-film dielectric layer and the layer top side of the prefabricated dielectric layer.

8. The substrate of claim 7, wherein, wherein the laser perforations are conductor channels formed through from the thin-film top side of the thin-film dielectric layer to contact the adhesive layer.

9. The substrate of claim 7, wherein the adhesive layer forms part of the thin-film dielectric layer prior to lamination to the prefabricated dielectric layer, whereby the thin-film layer is laminated to the prefabricated dielectric layer by bringing the adhesive layer into contact with the layer top surface of the prefabricated dielectric layer.

10. The substrate of claim 9, wherein the laser-ablated perforations are prefabricated in the thin-film dielectric layer, and wherein the thin-film dielectric layer is applied to the layer top side of the prefabricated dielectric layer after alignment of the laser-ablated perforations with the circuit material pattern.

11. The substrate of claim 1, wherein the prefabricated dielectric layer has a circuit material pattern formed on both a layer top side and a layer bottom side thereof, and wherein the substrate further comprises:
- a second thin-film dielectric layer having a thin-film top side laminated to the bottom side of the prefabricated dielectric layer and having second laser-ablated perforations formed on a second thin-film bottom side; and
- second conductive circuit material deposited within the second laser-ablated perforations for forming a second conductive pattern above the second thin-film bottom side within the second thin-film dielectric layer.

12. The substrate of claim 1, wherein the prefabricated dielectric layer is a multi-layer prefabricated circuit board having at least one internal circuit material pattern.

13. The substrate of claim 12, wherein the laser-ablated perforations include blind via holes formed through the thin-film dielectric layer and at least one layer of the multi-layer prefabricated circuit board, and wherein the conductive material is deposited within the blind via holes from the thin-film top side of the thin-film dielectric layer to contact the at least one internal circuit material pattern.

14. A substrate for a microelectronic circuit, comprising:
- a prefabricated dielectric layer having a circuit material pattern formed on a top side thereof;
- means for providing a first laminated circuit layer above the circuit material pattern and forming electrical connections with the circuit material pattern; and
- means for providing conductors within the top side of the thin-film dielectric layer that do not contact the circuit material pattern.

15. The substrate of claim 14, wherein the prefabricated dielectric layer is a dielectric film.

16. The substrate of claim 14, further comprising means for providing blind vias from the top side of the dielectric layer to contact the circuit material pattern.

17. The substrate of claim 14, wherein the prefabricated dielectric layer further has a second circuit material pattern formed on a layer bottom side thereof, and wherein the substrate further comprises means for providing a second laminated circuit layer below the second circuit material pattern and forming electrical connections with the second circuit material pattern.

18. A substrate for a microelectronic circuit, comprising:
- a prefabricated rigid dielectric layer having a first circuit material pattern formed on a layer top side thereof;
- a dielectric film layer having a thin-film bottom side laminated to the layer top side of the prefabricated dielectric layer and having laser-ablated channels formed on a thin-film top side thereof, said channels filled with conductive material forming a second conductive pattern running parallel to said first conductive pattern and not contacting said first conductive pattern and further having laser-ablated perforations extending through from said layer top side to said layer bottom side and filled with conductive material forming vias from said second conductive pattern to said first conductive pattern, whereby said second conductive pattern is provided below the thin-film top side within the thin-film dielectric layer.

\* \* \* \* \*